(12) United States Patent
Uno et al.

(10) Patent No.: US 7,760,049 B2
(45) Date of Patent: Jul. 20, 2010

(54) FILM BULK ACOUSTIC RESONATOR, FILTER, AND FABRICATION METHOD THEREOF

(75) Inventors: Takashi Uno, Hyogo (JP); Naohiro Tsurumi, Kyoto (JP); Kazuhiro Yahata, Osaka (JP); Hiroyuki Sakai, Kyoto (JP)

(73) Assignee: Panasonic Corporation, Osaka (JP)

( * ) Notice: Subject to any disclaimer, the term of this patent is extended or adjusted under 35 U.S.C. 154(b) by 44 days.

(21) Appl. No.: 11/806,123

(22) Filed: May 30, 2007

(65) Prior Publication Data

US 2007/0279155 A1 Dec. 6, 2007

(30) Foreign Application Priority Data

May 30, 2006 (JP) .............................. 2006-149755
Jul. 26, 2006 (JP) .............................. 2006-203023

(51) Int. Cl.
*H03H 9/00* (2006.01)

(52) U.S. Cl. ........................ 333/193; 333/186; 333/187; 333/195

(58) Field of Classification Search .......... 333/186–195
See application file for complete search history.

(56) References Cited

U.S. PATENT DOCUMENTS

| | | | | |
|---|---|---|---|---|
| 6,377,137 B1* | 4/2002 | Ruby | ........................ | 333/189 |
| 6,384,697 B1* | 5/2002 | Ruby | ........................ | 333/189 |
| 6,842,088 B2* | 1/2005 | Yamada et al. | .............. | 333/187 |
| 6,933,809 B2* | 8/2005 | Kyoung et al. | .............. | 333/193 |
| 7,212,082 B2* | 5/2007 | Nagao et a | .................. | 333/187 |
| 7,230,509 B2* | 6/2007 | Stoemmer | .................... | 333/133 |
| 7,332,985 B2* | 2/2008 | Larson et al. | ............... | 333/187 |
| 7,335,395 B2* | 2/2008 | Ward et al. | ................... | 427/198 |
| 7,342,351 B2* | 3/2008 | Kubo et al. | ................. | 310/344 |
| 7,355,324 B2* | 4/2008 | Kim et al. | .................... | 310/320 |
| 7,463,118 B2* | 12/2008 | Jacobsen | .................... | 333/187 |
| 7,542,113 B2* | 6/2009 | Yoshii et al. | ................ | 349/113 |
| 2003/0205736 A1* | 11/2003 | Kozaki | ........................ | 257/200 |
| 2004/0091011 A1* | 5/2004 | Liu | ............................. | 372/46 |
| 2004/0257171 A1* | 12/2004 | Park et al. | .................... | 333/133 |
| 2005/0023472 A1* | 2/2005 | Wei et al. | .................... | 250/368 |
| 2005/0068124 A1* | 3/2005 | Stoemmer | .................... | 333/189 |
| 2005/0093157 A1* | 5/2005 | Noguchi et al. | ............. | 257/753 |
| 2005/0098789 A1* | 5/2005 | Kozaki | ........................ | 257/97 |
| 2005/0140466 A1* | 6/2005 | Larson et al. | ............... | 333/187 |
| 2005/0151600 A1* | 7/2005 | Takeuchi et al. | ............ | 333/191 |
| 2006/0092079 A1* | 5/2006 | de Rochemont | ...... | 343/700 MS |
| 2006/0097823 A1* | 5/2006 | Fujii et al. | .................. | 333/187 |
| 2006/0139121 A1* | 6/2006 | Jhung | ........................... | 333/133 |
| 2007/0035364 A1* | 2/2007 | Sridhar et al. | ............... | 333/191 |

FOREIGN PATENT DOCUMENTS

JP 2005-136761 5/2005

\* cited by examiner

*Primary Examiner*—Rexford N Barnie
*Assistant Examiner*—Matthew C Tabler
(74) *Attorney, Agent, or Firm*—McDermott Will & Emery LLP

(57) ABSTRACT

A film bulk acoustic resonator includes a substrate; an acoustic reflector portion formed on the substrate; and an acoustic resonator portion including a lower electrode, a piezoelectric film, and an upper electrode which are sequentially stacked on the acoustic reflector portion, An uppermost layer of the acoustic reflector portion which is in contact with the acoustic resonator portion has a root-mean-square roughness of approximately 1 nm or less.

5 Claims, 9 Drawing Sheets

FILM BULK ACOUSTIC RESONATOR, FILTER, AND FABRICATION METHOD THEREOF

CROSS-REFERENCE TO RELATED APPLICATION(S)

This application claims priority under 35 U.S.C. §119(a) on Japanese Patent Applications No. 2006-149755 filed on May 30, 2006, and No. 2006-203023 filed on Jul. 26, 2006, the entire contents of claims, specifications and drawings of which are hereby incorporated by reference.

BACKGROUND OF THE INVENTION

1. Field of the Invention

The present invention relates to a film bulk acoustic resonator, a filter, and a fabrication method thereof. Specifically, the present invention relates to a film bulk acoustic resonator including an acoustic reflector portion, a filter and a fabrication method thereof.

2. Description of the Prior Art

As recent mobile phone terminals have been produced in multi-band configurations, multiplexers and interstage filters have been required to have lower insertion loss and steeper attenuation characteristics than were previously required. A film bulk acoustic resonator (FBAR) is a bulk acoustic resonator utilizing the resonance of an elastic wave along the thickness of a piezoelectric film. A FBAR filter which is comprised of the FBARs connected in a ladder configuration has received attention as a filter capable of achieving low-loss and steep attenuation characteristics.

The film bulk acoustic resonator includes a resonator portion. The resonator portion is composed of a piezoelectric film, an upper electrode formed on an upper surface of the piezoelectric film, and a lower electrode formed on a lower surface of the piezoelectric film. In order to confine an acoustic wave generated by excitation of the piezoelectric film to the resonator portion, it is required to further provide a cavity, an acoustic reflector portion, or the like over and under the resonator portion. The acoustic reflector portion is composed of low acoustic impedance layers and high acoustic impedance layers which are alternately stacked on a substrate. The acoustic impedance of the high acoustic impedance layers is higher than that of the low acoustic impedance layers.

Since resonance characteristics of the film bulk acoustic resonator are influenced by crystallinity of a piezoelectric material, a piezoelectric film having good crystallinity is indispensable in order to realize an excellent filter characteristic. Moreover, it is generally known that in order to obtain the piezoelectric film having the good crystallinity, upper surfaces of the lower electrode formed under the piezoelectric film and also of the acoustic reflector portion formed under the lower electrode have to be smoothed.

When the low acoustic impedance layers and the high acoustic impedance layers are alternately formed on the substrate by general chemical vapor deposition (CVD), sputtering, or the like to form the acoustic reflector portion, bumps and dips on a surface of each of the layers are made greater due to a layer-stacking configuration. Therefore, it is very difficult to smooth a surface of the acoustic reflector portion.

For example, if a film forming condition is optimized when each of the layers included in the acoustic reflector portion is formed by CVD or sputtering, the root-mean-square roughness (Rms) of a surface of one layer can be suppressed to about several nanometers. However, if a plurality of layers is formed, the surface roughness is accumulated. As a result, the Rms of the surface of the configured acoustic reflector portion has a value of about several tens of nanometers.

To cope with this problem, it is attempted that after the acoustic reflector portion is formed, the surface of the acoustic reflector portion is smoothed by chemical mechanical polishing (CMP), or that an acoustic reflector portion is formed by bias sputtering to smooth a surface of the acoustic reflector portion (for example, see Japanese Laid-Open Patent Publication No. 2005-136761).

However, the above-mentioned conventional film bulk acoustic resonator has such a problem that a fabrication method thereof is complicated. Bias sputtering requires special equipment, and setting a sputtering condition is also troublesome. Moreover, there is a problem that when the upper surface of the acoustic reflector portion is smoothed by CMP, steps are complicated. Especially, since the thickness of each layer included in the acoustic reflector portion has to be accurately adjusted to the wavelength of the acoustic wave which is generated by excitation of the piezoelectric film in the resonator portion, it is also necessary to monitor the polishing amount as well as the smoothness.

SUMMARY OF THE INVENTION

In view of the conventional problems mentioned above, an object of the present invention is to easily realize a film bulk acoustic resonator including a piezoelectric film which has a good crystallinity.

To achieve the object mentioned above, a film bulk acoustic resonator of the present invention is configured such that the film bulk acoustic resonator includes an acoustic reflector portion whose top surface has a root-mean-square roughness of 1 nm or less.

A film bulk acoustic resonator of the present invention includes: a substrate; an acoustic reflector portion formed on the substrate; and an acoustic resonator portion including a lower electrode, a piezoelectric film, and an upper electrode which are sequentially stacked on the acoustic reflector portion, wherein an uppermost layer of the acoustic reflector portion which is in contact with the acoustic resonator portion has a root-mean-square roughness of approximately 1 nm or less.

According to the film bulk acoustic resonator of the present invention, the acoustic resonator portion is formed on a very smooth surface, allowing formation of a piezoelectric film which has a good film quality. As a result, it is possible to realize a film bulk acoustic resonator having excellent resonance characteristics.

In the film bulk acoustic resonator of the present invention, it is preferable that the uppermost layer of the acoustic reflector portion which is in contact with the acoustic resonator portion is a film formed by spin coating. In this configuration, it is possible to certainly smooth an upper surface of the acoustic reflector portion which is the layer being in contact with the acoustic resonator portion.

In the film bulk acoustic resonator of the present invention, a material forming the acoustic reflector portion may include an organic solvent or an inorganic solvent for spin coating.

In the film bulk acoustic resonator of the present invention, it is preferable that the acoustic reflector portion is a low acoustic impedance layer which is formed of a material having an acoustic impedance value lower than that of the lower electrode which is included in the acoustic resonator portion, and the low acoustic impedance layer is a film formed by spin coating. In this configuration, the acoustic reflector portion which is the layer being in contact with the acoustic resonator portion is formed by spin coating, which makes it possible to easily form a smooth surface of the acoustic reflector portion. Moreover, since the acoustic impedance of the acoustic reflector portion is lower than that of the lower electrode, the acoustic wave is reflected off an interface between the lower electrode and the acoustic reflector portion. Therefore, it is possible to confine the acoustic wave to the acoustic resonator portion.

In the film bulk acoustic resonator of the present invention, it is preferable that the acoustic reflector portion includes low acoustic impedance layers and high acoustic impedance layers which are alternately stacked on the substrate, the acoustic impedance of the high acoustic impedance layers being higher than that of the low acoustic impedance layers. As in this configuration, stacking materials having different acoustic impedances makes it possible to confine the acoustic wave to the acoustic resonator because the acoustic wave is reflected off each of interfaces between the materials having the different acoustic impedances in the acoustic reflector portion even in a case where the ratio between the acoustic impedance value of the lower electrode and the acoustic impedance value of the low acoustic impedance layer is small and the acoustic wave is not completely reflected off the interface between the lower electrode and the acoustic reflector portion.

In this case, it is preferable that each of the low acoustic impedance layers is a film formed by spin coating. Moreover, it is preferable that each of the low acoustic impedance layers is formed of a spin-on glass material, a fluorine-based resin material, a silicone-based resin material, or an epoxy-based resin material.

In the film bulk acoustic resonator of the present invention, it is preferable that each of the high acoustic impedance layers is a film formed by spin coating. Since in this configuration, the number of layers formed by spin coating increases, the smoothness of each of the layers increases, so that it is possible to easily form an acoustic reflector portion which has a smoother surface of the acoustic reflector portion. Moreover, it is preferable that all of the low acoustic impedance layers and the high acoustic impedance layers composing the acoustic reflector portion are formed by spin coating.

In the film bulk acoustic resonator of the present invention, it is preferable that each of the high acoustic impedance layers and each of the low acoustic impedance layers are formed of an insulating material. According to this configuration, when a plurality of acoustic resonator portions is formed on the acoustic reflector, electrical coupling between the acoustic resonator portions adjacent to each other is suppressed. Therefore, it is possible to reduce the insertion loss when a filter circuit is formed.

In the film bulk acoustic resonator of the present invention, it is preferable that the acoustic reflector portion includes a smoothing layer formed on an uppermost part of the acoustic reflector portion. According to this configuration, it is possible to certainly smooth the upper surface of the acoustic reflector portion.

In the film bulk acoustic resonator of the present invention, it is preferable that the smoothing layer serves as one of the low acoustic impedance layers.

In the film bulk acoustic resonator of the present invention, it is preferable that the smoothing layer is formed by spin coating.

In the film bulk acoustic resonator of the present invention, it is preferable that the smoothing layer is formed of a spin-on glass material, a fluorine-based resin material, a silicone-based resin material, or an epoxy-based resin material.

In the film bulk acoustic resonator of the present invention, it is preferable that a plurality of acoustic resonator portions formed on the acoustic reflector portion are apart from each other, and each of the high acoustic impedance layers is divided into a plurality of regions corresponding to each of the acoustic resonator portions. According to this configuration, it is possible to suppress the electrical coupling between the acoustic resonator portions even when a metal film is used for each high acoustic impedance layer.

A filter of the present invention includes a plurality of film bulk acoustic resonators of the present invention.

In the filter of the present invention, it is preferable that the plurality of film bulk acoustic resonators includes: the acoustic reflector portion which includes a plurality of acoustic reflector portions separated each other for electrically-isolation; and the acoustic resonator portion which includes a plurality of acoustic resonator portions, each of the plurality of acoustic resonator portions being formed on each of the plurality of reflector portions. Alternatively, the plurality of film bulk acoustic resonators may include: the acoustic reflector portion; and the acoustic resonator portion which includes a plurality of acoustic resonator portions, the plurality of acoustic resonator portions being formed on the same acoustic reflector portion.

A fabrication method of a film bulk acoustic resonator of the present invention includes the steps of: (a) forming an acoustic reflector portion on a substrate; and (b) forming an acoustic resonator portion by sequentially forming a lower electrode, a piezoelectric film, and an upper electrode on the acoustic reflector portion, wherein step (a) includes forming an uppermost layer of the acoustic reflector portion which is in contact with the acoustic resonator portion by spin coating such that an upper surface of the layer has a root-mean-square roughness of approximately 1 nm or less.

According to the fabrication method of a film bulk acoustic resonator of the present invention, it is possible to form the piezoelectric film on a smooth surface. This makes it possible to form a piezoelectric film which has good crystallinity without complicating the steps. As a result, it is possible to realize a film bulk acoustic resonator which has excellent resonance characteristics.

In the fabrication method of a film bulk acoustic resonator of the present invention, it is preferable that step (a) includes forming a low acoustic impedance layer, an acoustic impedance value of the low acoustic impedance layer being lower than that of the lower electrode.

In the fabrication method of a film bulk acoustic resonator of the present invention, it is preferable that step (a) includes stacking a high acoustic impedance layer and the low acoustic impedance layer, an acoustic impedance value of the high acoustic impedance layer being higher than that of the low acoustic impedance layer.

In the fabrication method of a film bulk acoustic resonator of the present invention, it is preferable that step (a) includes forming a smoothing layer as the uppermost layer of the acoustic reflector portion which is in contact with the acoustic resonator portion.

It is preferable that the fabrication method of a film bulk acoustic resonator of the present invention further includes the steps of: (c) before step (a), selectively forming a sacrifice layer on the substrate such that the substrate is sectioned by the sacrifice layer into a plurality of regions, the sacrifice layer having a thickness thicker than a thickness of the acoustic reflector portion; and (d) after step (a) and before step (b), removing the sacrifice layer such that the acoustic reflector portion is divided into a plurality of regions, wherein step (b) includes forming the acoustic resonator portion in each of the regions of the divided acoustic reflector portion.

According to this configuration, it is possible to relieve stress which is caused in the film when the acoustic reflector portion is formed by spin coating and to suppress the occurrence of cracks. Therefore, it is possible to obtain a piezoelectric film having good crystallinity. Moreover, removing the sacrifice layer forms openings to divide the acoustic reflector portion. Since these openings can be used as scribe lines, it is possible to easily perform the dicing process to divide the wafer into chips.

In the fabrication method of a film bulk acoustic resonator of the present invention, it is preferable that the sacrifice layer is formed such that the distribution of a solution for the spin coating is kept in uniformly when the low acoustic impedance layers or the high acoustic impedance layers are formed by spin coating in step (a). In this configuration, even when the rotation speed at spin coating is low the acoustic reflector portions which have a good uniformity of the film thickness and the characteristics can be achieved.

In this case, it is preferable that the sacrifice layer is formed in a lattice-like arrangement avoiding a crossing point of the lattice on the substrate. In this configuration, it is possible to certainly prevent the nonuniform distribution of the solvent for spin coating.

In the fabrication method of a film bulk acoustic resonator of the present invention, it is preferable that step (a) includes (a1) after each one of the low acoustic impedance layers is formed by spin coating, selectively exposing the formed low acoustic impedance layer to light having a first wave length to partially crystallize the low acoustic impedance layer; (a2) after each one the high acoustic impedance layers is formed by spin coating, selectively exposing the formed high acoustic impedance layer to light having a second wave length to partially crystallize the high acoustic impedance layer; and (a3) after step (a1) and step (a2) are alternately repeated, removing uncrystallized parts of the partially crystallized low acoustic impedance layer and the partially crystallized high acoustic impedance layer to form the acoustic reflector portion which is divided into a plurality of regions, and step (b) includes forming the acoustic resonator portion in each of the regions of the divided acoustic reflector portion.

Moreover, step (a) may include: (a1) alternately stacking the low acoustic impedance layers and the high acoustic impedance layers by spin coating; (a2) respectively selectively exposing the stacked low acoustic impedance layers and the stacked high acoustic impedance layers to light having a first wave length to crystallize the low acoustic impedance layers and to light having a second wave length to crystallize the high acoustic impedance layers; (a3) removing uncrystallized parts of the crystallized low acoustic impedance layers and the crystallized high acoustic impedance layers to form the acoustic reflector portion divided into a plurality of regions, and step (b) may include forming the acoustic resonator portion in each of the regions of the divided acoustic reflector portion.

In this configuration, it is possible to crystallize a plurality of stacked layers in one step. Therefore, it is possible to greatly reduce the number of fabrication steps of the acoustic reflector portion.

BRIEF DESCRIPTION OF THE DRAWINGS

FIG. 3A shows a result of measurement of the piezoelectric film in case where the smoothing layer is provided, and FIG. 3B shows a result of measurement of the piezoelectric film in a case where the smoothing layer is not provided.

DESCRIPTION OF THE PREFERRED EMBODIMENTS

Embodiment 1

Figure 1:
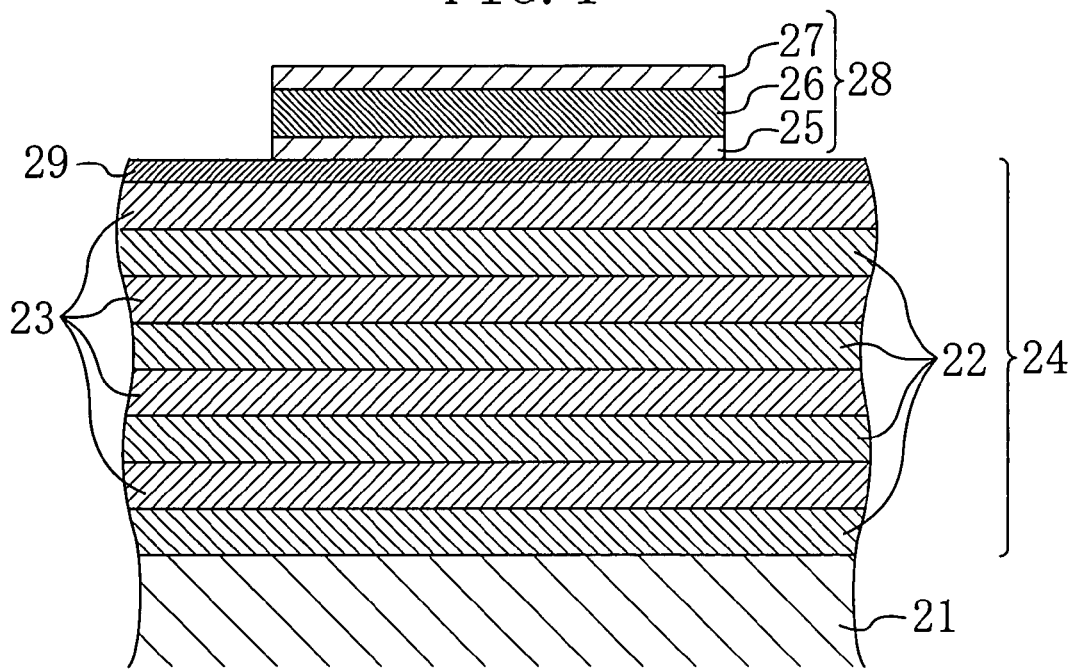
FIG. 1 is a cross section illustrating a film bulk acoustic resonator of Embodiment 1 of the present invention.

Embodiment 1 of the present invention will be described with reference to the drawings. FIG. 1 shows a cross-sectional configuration of a film bulk acoustic resonator of Embodiment 1 of the present invention. As shown in FIG. 1, the bulk acoustic resonator of Embodiment 1 includes an acoustic reflector portion 24 and an acoustic resonator portion 28. The acoustic reflector portion 24 includes high acoustic impedance layers 22 and low acoustic impedance layers 23 alternately stacked with a stacking cycle of 4 on a substrate 21 formed of silicon. The acoustic resonator portion 28 includes a lower electrode 25, a piezoelectric film 26, and an upper electrode 27 which are sequentially stacked on the acoustic reflector portion 24. Each of the low acoustic impedance layers 23 may be formed of an insulation material such as silicon oxide or silicon nitride, or a metal material such as aluminum or titanium. Moreover, each of the high acoustic impedance layers 22 may be formed of high melting point metal such as tungsten, platinum, iridium, or molybdenum, or an insulating material such as hafnium oxide, or aluminum nitride.

The acoustic reflector portion 24 includes a smoothing layer 29. The smoothing layer 29 is a spin-on-glass (SOG) film and formed on an uppermost part of the acoustic reflector portion 24. Therefore, an upper surface of the acoustic reflector portion 24 is very smooth. This makes it possible to make the surface of the lower electrode 25 smooth and to realize the good crystallinity of the piezoelectric film which is to be formed on the lower electrode 25.

In Embodiment 1, in order to realize a film bulk acoustic resonator having a resonance frequency of 2 GHz, the high acoustic impedance layers 22 and the low acoustic impedance layers 23 are alternately stacked with a stacking cycle of 4 on the substrate 21 formed of silicon to form the acoustic reflector portion 24, where each of the high acoustic impedance layers 22 is formed of tungsten with a thickness of 600 nm which corresponds to one fourth of the acoustic wave length, and each of the low acoustic impedance layers 23 is formed of silicon oxide with a thickness of 680 nm. In this case, the low acoustic impedance layer 23 formed on the uppermost part of the acoustic reflector portion 24 has rough surface with a root-mean-square roughness (Rms) of 2 nm. On the acoustic reflector portion 24 having rough surface with the Rms of 2 nm, the smoothing layer 29, which is the SOG film having a thickness of 100 nm is formed. In this case, the smoothing layer 29 has smooth surface with a Rms of 0.8 nm.

A SOG film which is formed by spin coating with a SOG solution and performing a thermal treatment can cover the bumps and dips on the surface of a foundation layer, so that the SOG film can obtain high smoothness and uniformity of film thickness. Since the SOG film is generally used to cover the bumps and dips of wires, a SOG film having a film thickness of several micrometers is usually adopted. However, inventors of the present invention found that if the solid content in the SOG solution is adjusted, it is possible to retain the smoothness and uniformity of the film thickness even with a SOG film having a film thickness of 100 nm or less after the thermal treatment.

Figure 2:
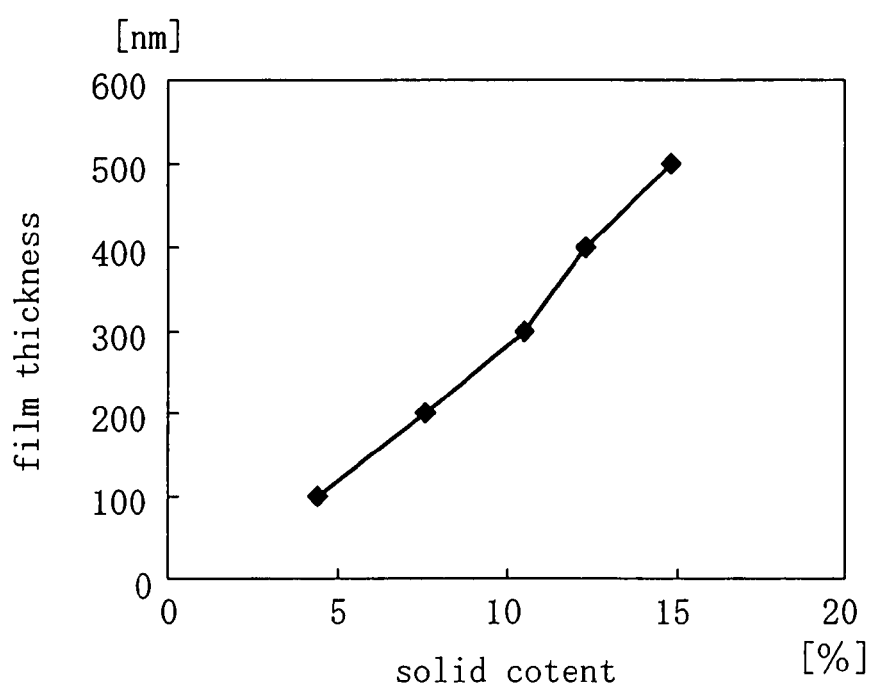
FIG. 2 is a graph showing a relationship between the film thickness and the solid content, with reference to which a forming method of a smoothing layer of the film bulk acoustic resonator of Embodiment 1 of the present invention is described.

FIG. 2 shows a relationship between the solid content in the SOG solution and the film thickness of the SOG film after the thermal treatment, where the SOG film is practically formed under such conditions that the rotation speed for spin coating is 3000 rpm and the temperature for the thermal treatment is 450° C. As shown in FIG. 2, it is obvious that the film thickness of the SOG film can be suitably controlled by changing the solid content in the SOG solution. Moreover, in these experimental conditions, a thin SOG film having a film thickness of 100 nm or less can be realized with such a solid content of less than 5% in the SOG solution. In this way, findings of the inventors of the present invention made it possible to realize the acoustic reflector portion 24 which has a very smooth surface by using the smoothing layer 29.

Figure 3A:
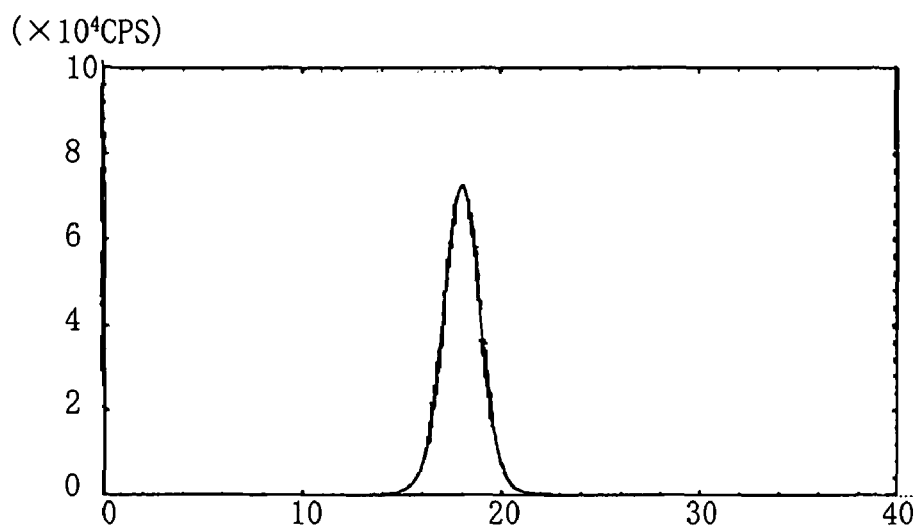
FIG. 3A and FIG. 3B show results of measurement of a crystallinity of a piezoelectric film, where
Figure 3B:
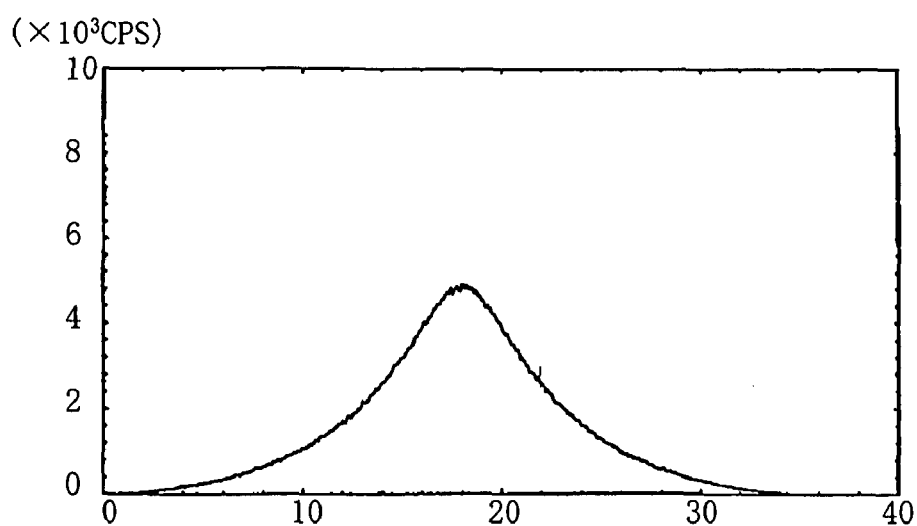

Forming the piezoelectric film on such a smooth acoustic reflector portion makes it possible to obtain a piezoelectric film having the excellent crystallinity. FIG. 3A and FIG. 3B show results of X-ray diffraction (XRD) measurement of the piezoelectric film formed on the acoustic reflector portion, wherein FIG. 3A shows the result of measurement of the piezoelectric film in a case where a smoothing layer is provided, and FIG. 3B shows the result of measurement of the piezoelectric film in a case where the smoothing layer is not provided. In FIG. 3A and FIG. 3B, each of the high acoustic impedance layers and each of the low acoustic impedance layers are respectively formed by a hafnium oxide film having a thickness of 500 nm and a silicon oxide film having a thickness of 680 nm. The high acoustic impedance layers and the low acoustic impedance layers are alternately stacked with a stacking cycle of 4 on the substrate formed of Si.

Note that the stacking cycle refers to the number of stacks of the low acoustic impedance layers and the high acoustic impedance layers, and one cycle refers to a stack consisting of a pair of the high acoustic impedance layer and the low acoustic impedance layer.

The smoothing layer is formed by the SOG film having a thickness of 100 nm. The lower electrode and the upper electrode are respectively formed by molybdenum films having a thickness of 500 nm. The piezoelectric film is formed by an aluminum nitride film having a thickness of 500 nm.

As shown in FIG. 3A and FIG. 3B, the half-width of a rocking curve in a case where the smoothing layer is provided is narrower than that in a case where the smoothing layer is not provided. Therefore, it is obvious that the aluminum nitride film having an excellent film quality is formed by using the smoothing layer.

Figure 4:
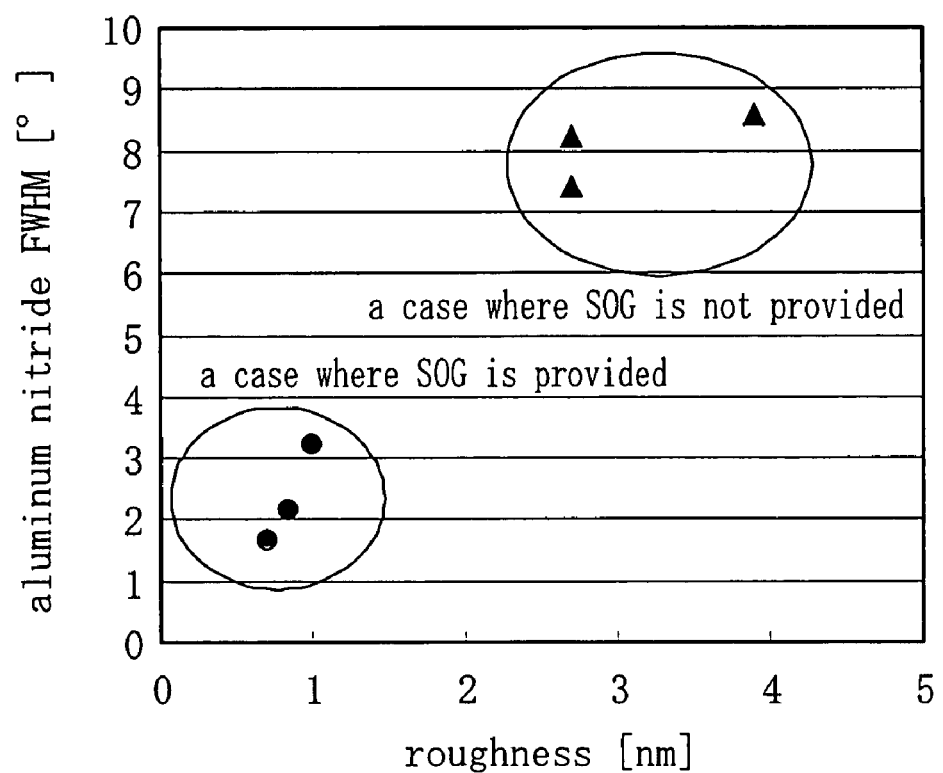
FIG. 4 is a graph illustrating a correlation between the smoothness of an upper surface of an acoustic reflector portion and the crystallinity of the piezoelectric film.

FIG. 4 shows a correlation of the value of the Rms at the upper surface of the acoustic reflector portion and the half-width of the rocking curve of the aluminum nitride film. In a case where the smoothing layer is not provided, as indicated by triangle marks in FIG. 4, the value of the Rms at the upper surface of the acoustic reflector portion is 2.5 nm to 4 nm, and thus the value of the half-width of the rocking curve of the aluminum nitride film is also large. Meanwhile, in a case where the smoothing layer is provided, as indicated by circle marks in FIG. 4, the value of the Rms at the upper surface of the acoustic reflector portion is equal to or less than 1 nm, and thus the half-width of the rocking curve of the aluminum nitride film is also small. This means that the aluminum nitride having an excellent film quality is obtained by using the smoothing layer.

As described above, providing the smoothing layer formed by the SOG film on the acoustic reflector portion makes it possible to reduce the value of the Rms of the uppermost layer of the acoustic reflector portion to or less than 1 nm. This improves the surface smoothness of an uppermost layer of the acoustic reflector portion which is in contact with the acoustic resonator portion. Therefore, it is possible to improve the film quality of the piezoelectric film of the acoustic resonator portion. As a result, a film bulk acoustic resonator which has excellent resonance characteristics is obtained. Moreover, using the film bulk acoustic resonator having the good resonance characteristic makes it possible to realize a filter which has the excellent frequency characteristics.

In Embodiment 1, the smoothing layer 29 is formed by the SOG film. However, the smoothing layer 29 may be formed of a fluorine-based resin material, a silicone-based resin material, an epoxy-based resin material, or the like which can be applied by spin coating instead of the SOG film.

In Embodiment 1, the smoothing layer 29 is formed on the uppermost part of the acoustic resonator portion 24. However, since an upper surface of a layer formed on a surface smoothed by the smoothing layer 29 is also smooth, the smoothing layer 29 is not necessarily formed on the uppermost part of the acoustic reflector portion 24. For example, in a case where the high acoustic impedance layers 22 and the low acoustic impedance layers 23 are stacked with a plurality of stacking cycles, the smoothing layer 29 may be formed between the highest layer of the high acoustic impedance layers 22 and the highest layer of the low acoustic impedance layers 23.

In Embodiment 1, the acoustic reflector portion 24 includes the high acoustic impedance layers 22 and the low acoustic impedance layers 23 stacked with a stacking cycle of 4. However, the number of the stacking cycle of the high acoustic impedance layers 22 and the low acoustic impedance layers 23 can be changed accordingly. Moreover, order of stacking the high acoustic impedance layers 22 and the low acoustic impedance layers 23 may be changed.

Embodiment 2

Figure 5:
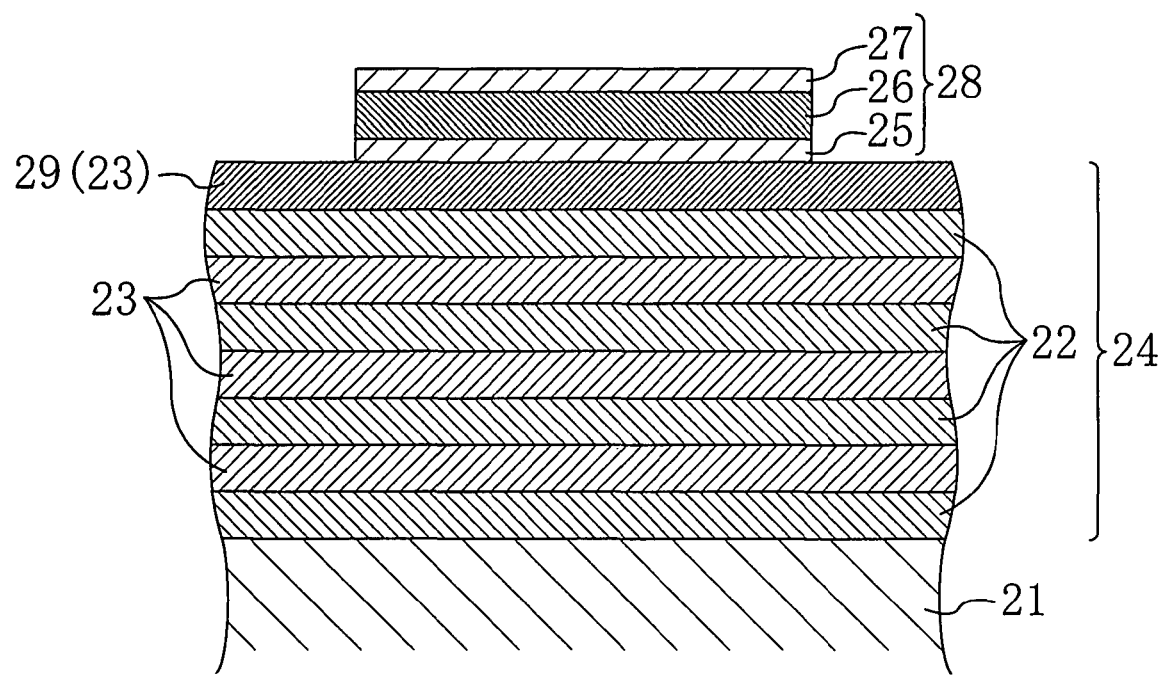
FIG. 5 is a cross section illustrating a film bulk acoustic resonator of Embodiment 2 of the present invention.

Embodiment 2 of the present invention will be described below with reference to the drawings. FIG. 5 shows a cross-sectional configuration of a film bulk acoustic resonator of Embodiment 2. In FIG. 5, components which are the same as those in FIG. 1 are given the same reference numerals as those in FIG. 1 and descriptions thereof are omitted.

As shown in FIG. 5, in the film bulk acoustic resonator of Embodiment 2, the smoothing layer 29 is used as the lower acoustic impedance layer 23 which the uppermost part of the acoustic resonator portion 24. As in this case, using the smoothing layer 29 as one of the low acoustic impedance layers 23 allows the smoothing layer 29 to serve as a part of the acoustic reflector portion 24, so that it is possible to obtain a film bulk acoustic resonator having a good characteristic.

As in Embodiment 1, the smoothing layer 29 may be formed of a SOG material, a fluorine-based resin material, a silicone-based resin material, an epoxy-based resin material, or the like. These materials have an acoustic impedance lower than that of a silicon oxide film which is widely used as the low acoustic impedance layers. Therefore, an acoustic reflection characteristic of the acoustic reflector portion 24 which has smoothing layer as the highest low acoustic impedance layer is improved compared to that of the acoustic reflector portion 24 which has a silicon oxide film as the highest low acoustic impedance layer. Moreover, it is possible to reduce the Rms directly under the lower electrode. Therefore, it is possible to realize a film acoustic resonator having a good characteristic.

Embodiment 3

Figure 6:
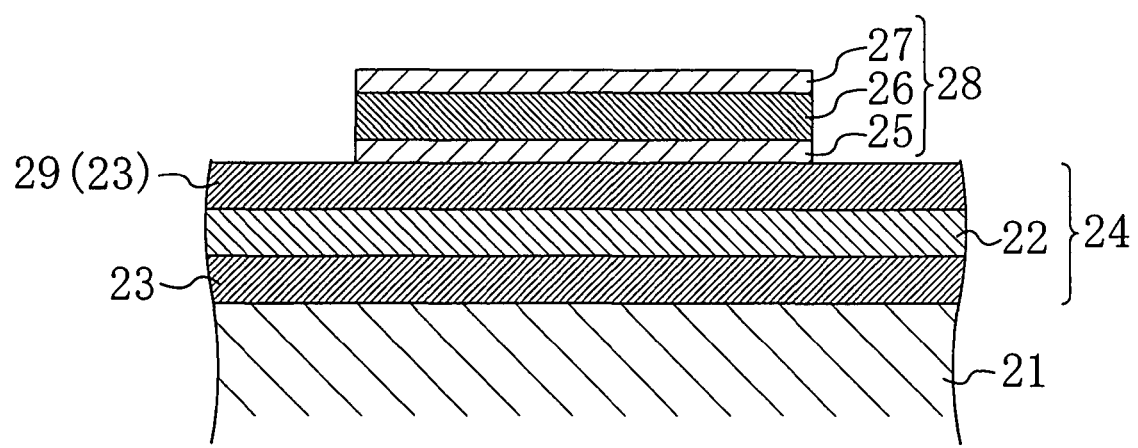
FIG. 6 is a cross section illustrating a film bulk acoustic resonator of Embodiment 3 of the present invention.

Embodiment 3 of the present invention will be described below with reference to the drawings. FIG. 6 shows a cross-sectional configuration of a film bulk acoustic resonator of Embodiment 3. In FIG. 6, components which are the same as those of FIG. 1 are given the same reference numerals as those of FIG. 1 and descriptions thereof are omitted.

As shown in FIG. 6, in the film bulk acoustic resonator of Embodiment 3, the low acoustic impedance layers 23 are formed by a SOG film, and the stacking cycle of the low acoustic impedance layers 23 and the high acoustic impedance layer 22 is 1.5 cycles.

The acoustic impedance of the SOG film is lower by an order of magnitude than that of the silicon oxide film which is generally used as each of the low acoustic impedance layers, and thus the acoustic reflector film 24 having the SOG film has a good acoustic reflection characteristic. Therefore, the acoustic reflector portion can be formed by stacking layers with a stacking cycle of about 1.5 to 2 in this configuration, although the acoustic reflector portion usually requires the high acoustic impedance layers and the low acoustic impedance layers stacked with a stacking cycle of 4 to 6. This greatly reduces the number of the steps required for forming the acoustic reflector portion 24.

Moreover, since the acoustic impedance of the low acoustic impedance layers 23 decreases, it is possible to use silicon oxide, silicon nitride, or the like to form the high acoustic impedance layer instead of conventionally used tungsten, or the like. This makes it easy to form the acoustic reflector portion 24. Therefore, it is also possible to reduce the fabrication cost.

The low acoustic impedance layers 23 may be formed by a fluorine-based resin film, a silicone-based resin material, an epoxy-based resin material, or the like instead of the SOG film.

Embodiment 4

Figure 7:
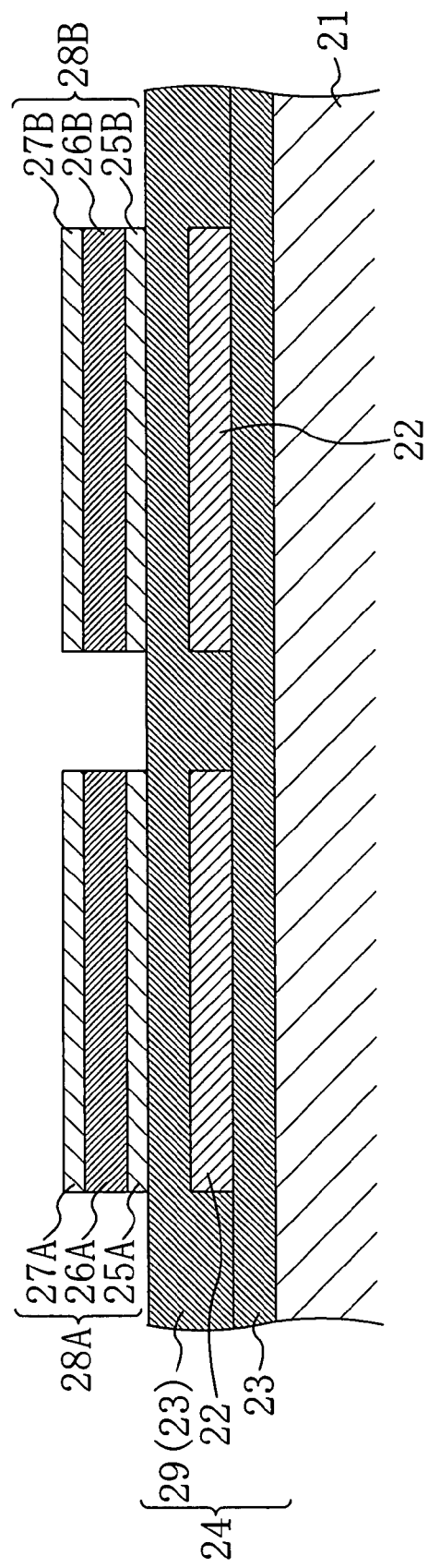
FIG. 7 is a cross section illustrating a film bulk acoustic resonator of Embodiment 4 of the present invention.

Embodiment 4 of the present invention will be described below with reference to the drawings. FIG. 7 shows a cross-sectional configuration of a film bulk acoustic resonator of Embodiment 4. In FIG. 7, components which are the same as those of FIG. 4 are given the same numerals as those of FIG. 4 and descriptions thereof are omitted.

As shown in FIG. 7, in the film bulk acoustic resonator of Embodiment 4, a first acoustic resonator portion 28A and a second acoustic resonator portion 28B are formed on the acoustic reflector portion 24. Moreover, each of the low acoustic impedance layers 23 of the acoustic reflector portion 24 is formed as one continuous layer for a region in which the first acoustic resonator portion 28A is formed and a region in which the second acoustic resonator portion 28B is formed. However, the high acoustic impedance layers 22 are formed independently of each other for the region in which the first acoustic resonator portion 28A is formed and the region in which the second acoustic resonator portion 28B is formed. That is, in the acoustic reflector portion 24, the high acoustic impedance layer 22 is separated between the first acoustic reflector portion 28A and the second acoustic reflector portion 28B. In this configuration, even if a metal material such as tungsten is used for the high acoustic impedance layer 22, it is possible to suppress electric coupling of the first acoustic reflector portion 28A and the second acoustic reflector portion 28B, the electric coupling being caused via capacitance between a lower electrode 25A of the first acoustic resonator portion 28A and the high acoustic impedance layer 22 and capacitance between a lower electrode 25B of the second acoustic reflector portion 28B and the high acoustic impedance layer 22.

In FIG. 7, two acoustic resonator portions are formed by way of example. However, more than two acoustic resonator portions may be formed. Moreover, the same effects can be obtained also in the configuration of Embodiment 1 or Embodiment 2, if a plurality of acoustic resonator portions is formed on the acoustic reflector portion but a conductive layer in the acoustic reflector portion is not formed between the acoustic resonator portions.

Embodiment 5

Figure 8:
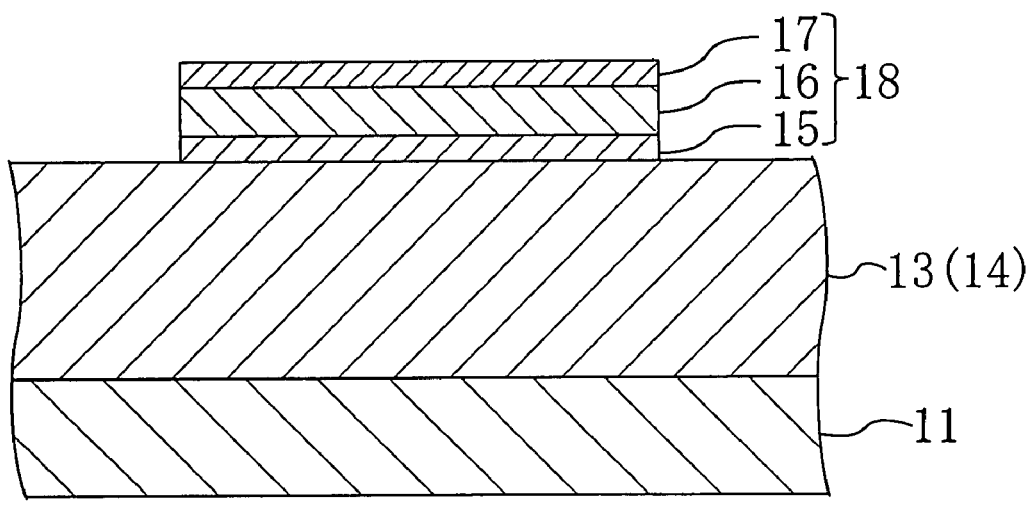
FIG. 8 is a cross section illustrating a film bulk acoustic resonator of Embodiment 5 of the present invention.

Embodiment 5 of the present invention will be described with reference to the drawings. FIG. 8 shows a cross-sectional configuration of a film bulk acoustic resonator of Embodiment 5. The film bulk acoustic resonator of Embodiment 5 includes an acoustic reflector portion 14 and an acoustic resonator portion 18. The acoustic reflector portion 14 is formed on a substrate 11 formed of silicon, and the acoustic resonator portion 18 is formed on the acoustic reflector portion 14.

The acoustic reflector portion 14 is formed by a spin-on glass (SOG) film having a thickness of 1 μm. The acoustic resonator portion 18 includes a lower electrode 15, a piezoelectric film 16, and an upper electrode 17 which are sequentially formed.

The acoustic reflector portion 14 of Embodiment 5 is formed by depositing the SOG film on the substrate 11 by spin coating. In spin coating, a solution of a film-forming material dissolved in a solvent is applied on, for example, the substrate by spin coating, and then a thermal treatment is performed to dry off the solvent to form a film. Since the film formed by spin coating has excellent smoothness and uniformity regardless of bumps and dips of an underlying layer, this film is generally formed as an interlayer insulation film in a wiring layer of a semiconductor device in order to modify and to smooth the bumps and dips formed after the wiring step. Therefore, an acoustic reflector portion formed by spin coating on a substrate without bumps and dips can highly increase the smoothness of an upper surface thereof.

In the film bulk acoustic resonator of Embodiment 5, the root-mean-square roughness (Rms) at an upper surface of the acoustic reflector portion 14 is practically measured, so that the Rms is in a range between 0.7 nm and 1 nm, and thus the upper surface of the acoustic reflector portion 14 has very good smoothness. Since the Rms at the upper surface of the acoustic reflector portion 14 is equal to or less than 1 nm and the upper surface of the acoustic reflector portion 14 is very smooth, the smoothness of an upper surface of the lower electrode 15 which is formed on the acoustic reflector portion 14 significantly increases. This makes it possible to improve the crystallinity of the piezoelectric film 16 formed on the lower electrode 15.

The acoustic reflector portion 14 is composed of a film which can be formed by spin coating and which has an acoustic impedance value smaller than that of the lower electrode 15. If the lower electrode 15 is formed of molybdenum and the acoustic reflector portion 14 is composed of a SOG film, the ratio of the acoustic impedance value of the lower electrode 15 to the acoustic impedance value of the acoustic reflector portion 14 is equal to or greater than 10:1, and thus the reflectance ratio is equal to or greater than 80%. Therefore, it is possible to confine the acoustic wave to the acoustic resonator portion 18. Moreover, a fluorine-based resin material, a silicone-based resin material, an epoxy-based resin material, or the like which can be applied by spin coating may be used instead of the SOG film.

The substrate 11 may be an insulating substrate formed of, for example, quartz, sapphire, gallium arsenide, or the like instead of a silicon substrate.

Embodiment 6

Figure 9:
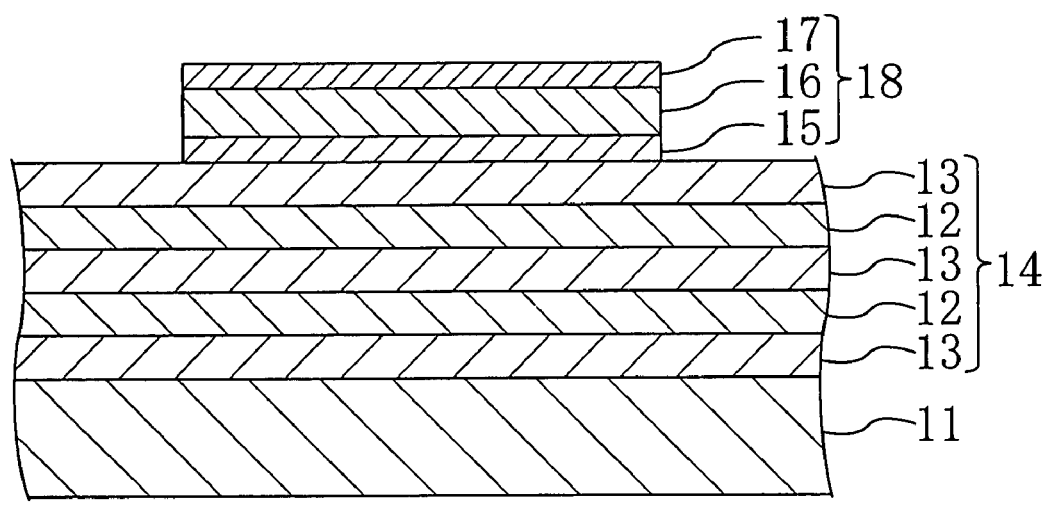
FIG. 9 is a cross section illustrating a film bulk acoustic resonator of Embodiment 6 of the present invention.

Embodiment 6 of the present invention will be described below with reference to the drawings. FIG. 9 shows a cross-sectional configuration of a film bulk acoustic resonator of Embodiment 6. In FIG. 9, components which are the same as those of FIG. 8 are given the same reference numerals as those of FIG. 8 and descriptions thereof are omitted.

As shown in FIG. 9, in the film bulk acoustic resonator of Embodiment 6, the acoustic reflector portion 14 is composed of high acoustic impedance layers 12 and low acoustic impedance layers 13 which are alternately stacked. Since the high acoustic impedance layers 12 and the low acoustic impedance layers 13 are formed by spin coating, it is possible that the smoothness at an upper surface of the acoustic reflector portion 14 is equal to or less than 1 nm.

In order to realize a film bulk acoustic resonator having a resonance frequency of 2 GHz, the high acoustic impedance layers 12 and the low acoustic impedance layers 13 are alternately stacked with a stacking cycle of 4, where each of the high acoustic impedance layers 12 is formed of hafnium oxide to have a thickness of 500 nm and each of the low acoustic impedance layers 13 is formed of a SOG film to have a thickness of 300 nm. In this configuration, the Rms at the upper surface of the acoustic reflector portion 14 is within a range of 0.7 nm to 1 nm.

The film bulk acoustic resonator of Embodiment 6 includes the high acoustic impedance layers 12 and the low acoustic impedance layers 13 which are stacked with a plurality of stacking cycles. Therefore, in this configuration, the reflectance of the acoustic reflector portion 14 can be improved compared to that in the configuration in which the high acoustic impedance layer 12 and the low acoustic impedance layer 13 is stacked with a stacking cycle of 1. Therefore, it is possible to efficiently confine the acoustic wave to the resonator portion.

In Embodiment 6, each of the high acoustic impedance layers 12 and each of the low acoustic impedance layers 13 are formed of an insulation material. However, a conductive material which can be applied by spin coating may be used.

Moreover, a film formed by spin coating can modify bumps and dips on an underlying layer. Therefore, forming only one of the high acoustic impedance layers 12 and low acoustic impedance layers 13 which are stacked by spin coating makes it possible to obtain the effect of smoothing the upper surface of the acoustic reflector portion 14. For example, after high acoustic impedance layers and low acoustic impedance layers are formed by CVD, sputtering, or the like, a high acoustic impedance layer or a low acoustic impedance layer is formed thereon by spin coating, so that it is possible to obtain an acoustic reflector portion 14 whose upper surface is smooth.

Embodiment 7

Embodiment 7 of the present invention will be described below with reference to the drawings. FIG. 10 and FIG. 11 show a fabrication method of a film bulk acoustic resonator of Embodiment 7, wherein FIG. 10 shows top views of the film bulk acoustic resonator in the order of steps and FIG. 11 shows cross sections of the film bulk acoustic resonator in the order of steps.

As shown in FIG. 10 and FIG. 11, the fabrication method of the film bulk acoustic resonator of Embodiment 7 makes it possible to easily form a plurality of film bulk acoustic resonators on a substrate.

Figure 10A:
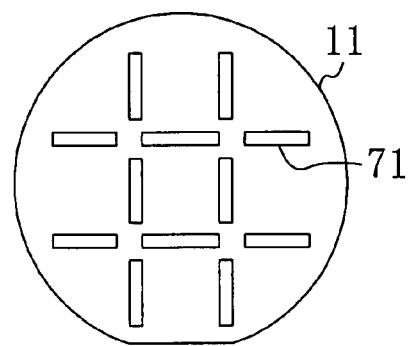
FIG. 10A through FIG. 10D are top views illustrating a fabrication method of a film bulk acoustic resonator in the order of steps of Embodiment 7 of the present invention.
Figure 11A:
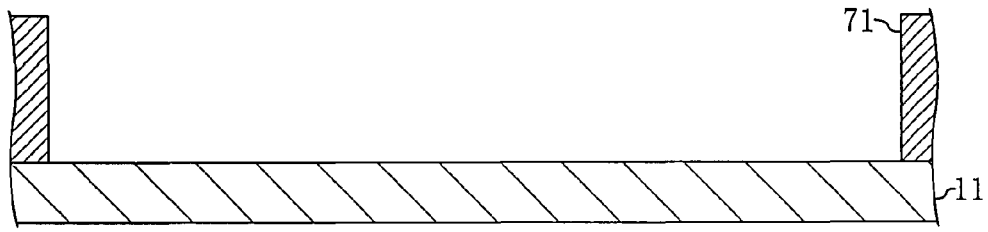
FIG. 11A through FIG. 11 are cross sections illustrating a fabrication method of a film bulk acoustic resonator in the order of steps of Embodiment 7 of the present invention.

First, as shown in FIG. 10A and in FIG. 11A, molybdenum is deposited on the substrate 11 to form a film having, for example, a thickness of 4 μm, and then patterned to form a sacrifice layer 71. As a result, the substrate 11 is sectioned by the sacrifice layer 71 into a plurality of regions. Note that, the sacrifice layer 71 is patterned such that the solution can be applied uniformly in a spin coating step performed later. For example, when the sacrifice layer 71 is formed in a lattice-like arrangement as shown in FIG. 10A such that the substrate 11 is sectioned into the plurality of regions, the sacrifice layer 71 is not formed on crossing points of the lattice in order to form paths through which the solution is released. However, openings at the crossing points are not necessarily required. Increasing the rotation speed for spin coating allows the solution to be released.

Figure 10B:
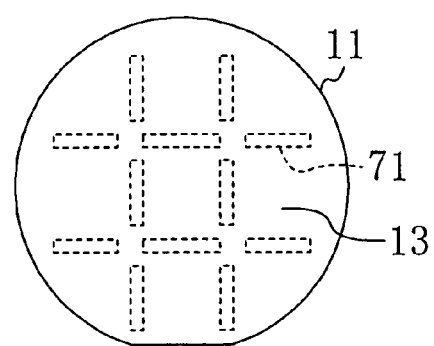
Figure 11B:
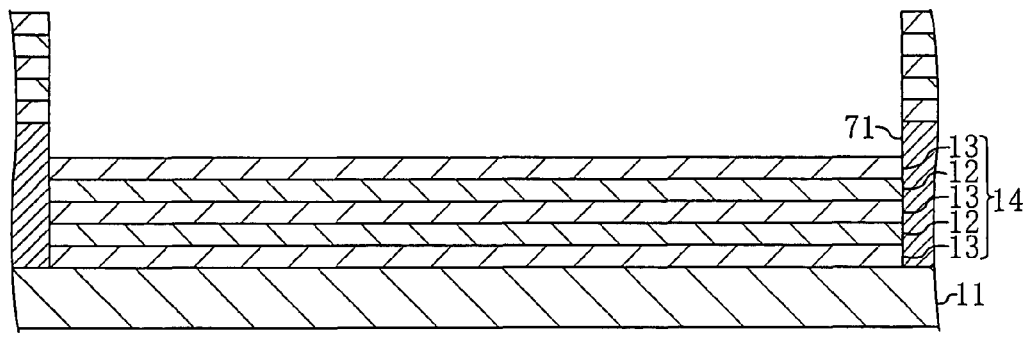

Next, as shown in FIG. 10B and FIG. 11B, the high acoustic impedance layers 12 and the low acoustic impedance layers 13 are alternately stacked by spin coating on the substrate 11 having the sacrifice layer 71. For example, in a case where a hafnium oxide film is used for each of the high acoustic impedance layers 12 and a SOG film is used for each of the low acoustic impedance layers 13, the steps of: applying a hafnium oxide solution by spin coating and drying the applied hafnium oxide solution at a temperature of 150° C. in the atmosphere; and applying a SOG solution by spin coating and drying the applied SOG solution at a temperature of 150° C. in the atmosphere are alternately repeated to stack the low acoustic impedance layers 13 and the high acoustic impedance layers 12 with a stacking cycle of 3 to 6. After stacking the low acoustic impedance layers 13 and high acoustic impedance layers 12, a thermal treatment is performed at a temperature of 650° C. in the nitrogen atmosphere or in the air to crystallize the low acoustic impedance layers 13 and the high acoustic impedance layers 12.

Figure 10C:
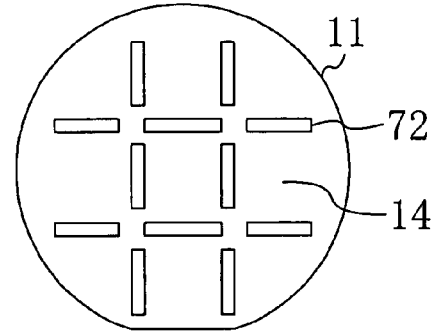
Figure 11C:
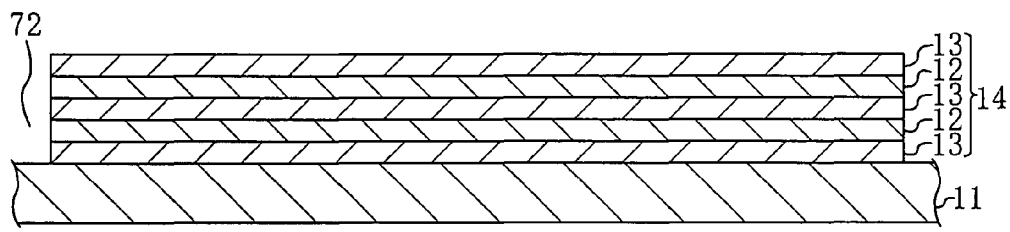

Then, as shown in FIG. 10C and FIG. 11C, the sacrifice layer 71 is removed, so that grooves 72 and a plurality of acoustic reflector portions 14 which is separated from each other are formed on the substrate 11.

Figure 10D:
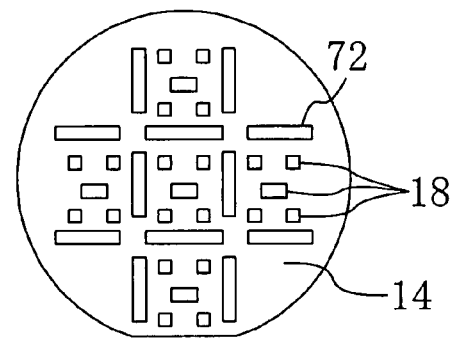
Figure 11D:
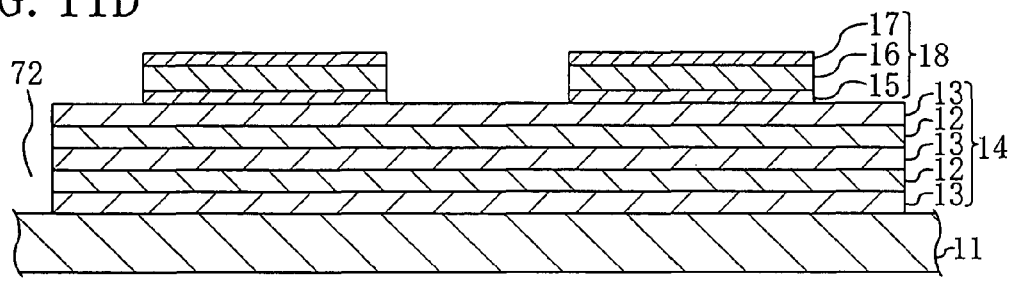

Next, as shown in FIG. 10D and FIG. 11D, lower electrodes 15, piezoelectric films 16, and upper electrodes 17 are sequentially stacked on each of the acoustic reflector portions 14 to form the acoustic resonator portions 18.

In spin coating, a solution containing, for example, an organic solvent is applied by spin coating, and then drying and thermal treatment are performed to dry off the solvent to form a film. Therefore, depending on viscosity, concentration, and the like of the solution, the contraction percentage of the film at the thermal treatment increases, and thus a stress occurs in the film. Especially when a film is formed to cover the whole of the substrate, the stress in the film greatly increases. As a result, a clack may occur in the surface of the acoustic reflector portion 14, which may deteriorate the crystallinity of the lower electrode 15 and the piezoelectric film 16.

However, in the fabrication method of the film bulk acoustic resonator of Embodiment 7, the sacrifice layer 71 is used to section the substrate 11 into the plurality of regions, and the acoustic reflector portion 14 is provided for each region. This makes it possible to reduce the stress in the film formed by spin coating and to suppress the generation of cracks. Therefore, it is possible to easily realize a film bulk acoustic resonator having a piezoelectric film which has an excellent crystallinity.

FIG. 10D shows an example where a plurality of acoustic resonator portions 18 is formed on each of the acoustic reflector portions 14. In this case, grooves formed in the step of removing the sacrifice layer 71 are used as scribe lines to divide the substrate 11, so that filter chips are obtained having a plurality of acoustic resonator portions 18 formed on each of the acoustic reflector portions 14. In the film bulk acoustic resonator of Embodiment 7, a plurality of acoustic resonator portions (in the example shown in FIG. 10D, five acoustic resonator portions) is formed on each of the acoustic reflector portions 14, which makes it possible to easily form a filter.

Unlike the example shown in FIG. 10D, in each of the film bulk acoustic resonators, the acoustic reflector portion 14 may be separated for each of the acoustic resonator portions 18, and each acoustic resonator portion 18 is formed on each of the separated acoustic reflector portions 14. In a filter including such film bulk acoustic resonators, since the acoustic reflector portion 14 is separated for each of the acoustic resonator portions 18, it is possible to use a metal film for each of the high acoustic impedance layers 12. This makes it possible to increase the impedance ratio between each of the high acoustic impedance layers 12 and each of the low acoustic impedance layers 13. Therefore, it is possible to reduce the number of stacking the high acoustic impedance layers 12 and the low acoustic impedance layers 13.

The narrower the regions in the separated acoustic reflector portions 14 are, the greater the effects of relieving the stress and suppressing generation of cracks become. However, there is no problem even if about several tens of acoustic resonator portions 18 are formed on each of the acoustic resonator portions 14.

Any material may be used to form the sacrifice layer 71 so long as the material can be removed without damaging the high acoustic impedance layers 12 and the low acoustic impedance layers 13. In a case where a hafnium oxide film is used for each of the high acoustic impedance layers 12, and a SOG film is used for each of the low acoustic impedance layers 13 as in Embodiment 7, the sacrifice layer 71 may be formed of molybdenum. Forming the sacrifice layer 71 of molybdenum makes it possible to easily remove only the sacrifice layer 71 by, for example, hydrogen peroxide solution. It is preferable that the thickness of the sacrifice layer 71 is greater than the thickness of each of the acoustic reflector portions 14 in order to realize certain independence of the plurality of acoustic reflector portions 14 of each other formed on the substrate.

When the high acoustic impedance layers 12 and the low acoustic impedance layers 13 are formed by spin coating, a small amount of components of the organic solvent including, a methyl group, a phenolic group, or the like may remain. However, even if the small amount of components of the organic solvent remains, the smoothness at the upper surface of the acoustic reflector portion 14 is hardly affected at all. The example where the organic solvent is used for spin coating has been described. However, spin coating may be performed by using an inorganic solvent such as hydroxide.

Embodiment 8

Embodiment 8 of the present invention will be described below with reference to the drawings. FIG. 12 shows a fabrication method of a film bulk acoustic resonator of Embodiment 8 in the order of steps.

Figure 12A:
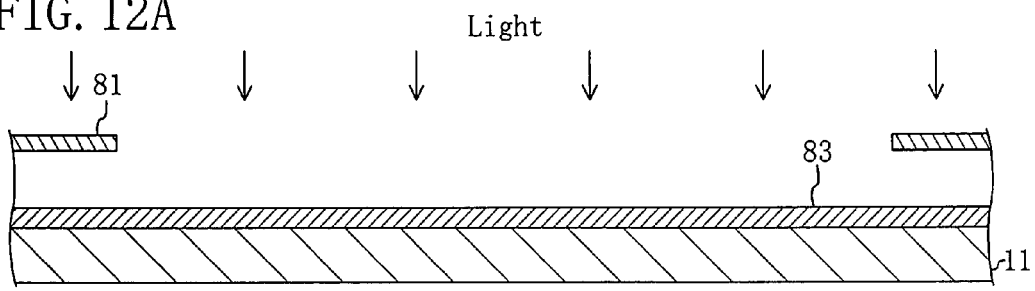
FIG. 12A through FIG. 12E are cross sections illustrating a fabrication method of a film bulk acoustic resonator in the order of steps of Embodiment 8 of the present invention.

First, as shown in FIG. 12A, a thin film 83 of a low acoustic impedance material is formed on the substrate 11 by spin coating. The thin film 83 is exposed with light through a mask 81. The light has a wave length at which the thin film 83 formed of the low acoustic impedance material crystallizes. As a result, in the thin film 83 formed of the low acoustic impedance material, only an exposed region 83A which is exposed with the light crystallizes through photochemical reactions, and a region 83B which is exposed with the light remains uncrystallized.

Figure 12B:
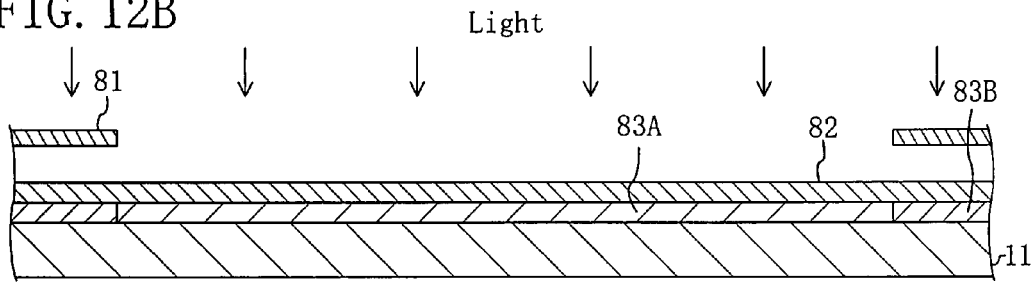

Next, as shown in FIG. 12B, a thin film 82 of a high acoustic impedance material is formed by spin coating. The thin film 82 is exposed with light through the mask 81. The light has a wave length at which the thin film 82 formed of the high acoustic impedance material crystallizes. As a result, in the thin film 82 formed of the high acoustic impedance material, only an exposed region 82A which is exposed with the light crystallizes, and a region 82B which is not exposed with the light does not crystallize. Ultraviolet laser such as excimer laser may be used as the light for crystallizing the thin film 83 formed of the low impedance material and the thin film 82 formed of the high impedance material.

Figure 12C:
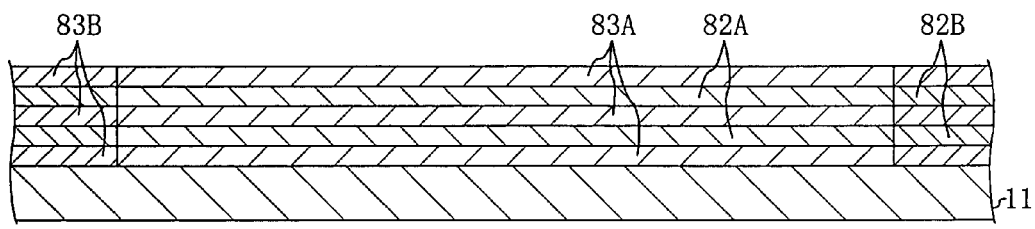

Next, these steps are repeated to form a layered product as shown in FIG. 12C. The layered product is composed of partially crystallized thin films 83 each being formed of the low acoustic impedance material and partially crystallized thin films 82 each being formed of the high acoustic impedance material.

Figure 12D:
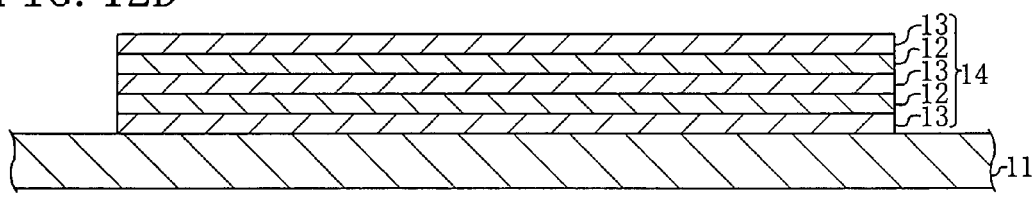

Then, as shown in FIG. 12D, uncrystallized parts of the obtained layered product are removed, so that a plurality of acoustic reflector portions 14 are formed on the substrate 11.

Figure 12E:
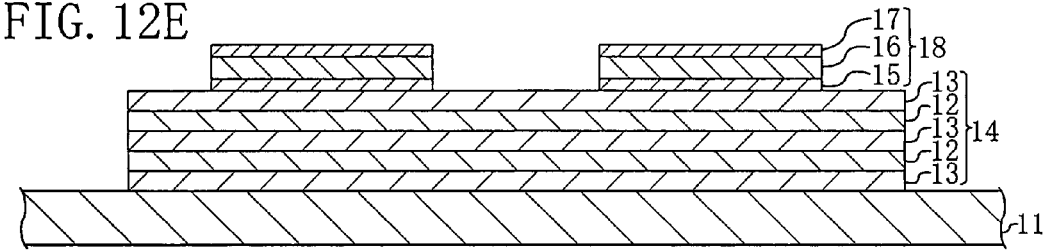

After that, as shown in FIG. 12E, lower electrodes 15, piezoelectric films 16, and upper electrodes 17 are sequentially stacked on each of the acoustic reflector portions 14 to form acoustic resonator portions 18. In this case, the arbitrary number of acoustic resonator portions 18 may be formed on each of the acoustic reflector portions 14.

Compared to the fabrication method of the film bulk acoustic resonator of Embodiment 7, the fabrication method of the film bulk acoustic resonator of Embodiment 8 does not require forming the sacrifice layer and performing a thermal treatment. Therefore, it is possible to reduce the number of steps and to easily realize integration into a transistor circuit.

In Embodiment 8, each layer of the thin films 82 each being formed of the high acoustic impedance material and the thin films 83 each being formed of the low impedance material is crystallized respectively. However, after all layers included in the acoustic reflector portion 14 are formed, all of the layers may be exposed with a laser beam having the wave length at which the thin film 82 formed of the high acoustic impedance material crystallizes and a laser beam having the wave length at which the thin film 83 formed of the high acoustic impedance material crystallizes. This further simplifies the manufacturing process.

In the examples described in Embodiments 5 through 8, a SOG film is used for the low acoustic impedance layer, and a hafnium oxide film is used for the high acoustic impedance layer. However, other two materials which can be applied by spin coating and which have different acoustic impedance values may be used, where one of the two materials which has a lower acoustic impedance is used for the low acoustic impedance layer and the other one of the two materials which has a higher acoustic impedance is used for the high acoustic impedance layer. In this case, the greater the acoustic impedance ratio between the low acoustic impedance layer and the high acoustic impedance layer is, the greater the effect of confining the acoustic wave to the acoustic resonator portion becomes.

Specifically, the low acoustic impedance layer may be formed of a fluorine-based resin material, a silicone-based resin material, an epoxy-based resin material, or the like. Moreover, the low acoustic impedance layer may be formed of, for example, silicon oxide, titanium oxide, or a compound of silicon oxide and boron oxide ($B_2O_3$) or phosphorus oxide ($P_2O_5$).

For the high acoustic impedance layer, a metal oxide film typified by hafnium oxide ($HfO_2$), a metal material, or the like which can be applied by spin coating may be used. Moreover, a piezoelectric film typified by lead zirconate titanate (Pb(ZrTi)$O_3$), barium titanate (BaTiO$_3$), a compound thereof, or the like may be used.

Note that, in a case where, for example, silicon oxide and a material which has the acoustic impedance lower than that of the silicon oxide are used in combination, the silicon oxide may be used as the high acoustic impedance layer.

These materials listed here are mere examples. An acoustic reflector portion can be configured by stacking any materials having different acoustic impedances.

In a case where only an uppermost layer of the acoustic reflector portion is formed by spin coating, the other layers may be formed by a usual low acoustic impedance material or high acoustic impedance material which deposited by conventional methods.

As described above, the film bulk acoustic resonator, the filter, and the fabrication method thereof according to the present invention make it possible to realize a film bulk acoustic resonator which includes a piezoelectric film having good crystallinity and being formed on a smooth surface and are applicable to a film bulk acoustic resonator including an acoustic reflector portion, a filter, or the like.

What is claimed is:

1. A film bulk acoustic resonator comprising:
a substrate;
an acoustic reflector portion formed on the substrate;
an acoustic resonator portion including a lower electrode, a piezoelectric film, and an upper electrode which are sequentially stacked on the acoustic reflector portion; and
a smoothing layer formed between the acoustic reflector portion and the acoustic resonator portion, wherein:
the acoustic reflector portion includes low acoustic impedance layers and high acoustic impedance layers which are alternately stacked on the substrate;
the high acoustic impedance layers have higher acoustic impedance than the low acoustic impedance layers;
the smoothing layer is an insulating layer, is in contact with the lower electrode and an uppermost part of the acoustic reflector portion, said smoothing layer is formed by spin coating, and has lower acoustic impedance than the low acoustic impedance layers; and
the uppermost part of the acoustic reflector portion is one of the high acoustic impedance layer.

2. A film bulk acoustic resonator comprising:
a substrate;
an acoustic reflector portion formed on the substrate;
an acoustic resonator portion including a lower electrode, a piezoelectric film, and an upper electrode which are sequentially stacked on the acoustic reflector portion; and
a smoothing layer formed between the acoustic reflector portion and the acoustic resonator portion, wherein:
the acoustic reflector portion includes low acoustic impedance layers and high acoustic impedance layers which are alternately stacked on the substrate;
the high acoustic impedance layers have higher acoustic impedance than the low acoustic impedance layers;
the smoothing layer is in contact with the lower electrode and an uppermost part of the acoustic reflector portion, is formed of a spin-on glass material, a fluorine-based resin material, a silicone-based resin material, or an epoxy-based resin material, and has lower acoustic impedance than the low acoustic impedance layers; and
the uppermost part of the acoustic reflector portion is one of the high acoustic impedance layers.

3. A film bulk acoustic resonator comprising:
a substrate;
an acoustic reflector portion formed on the substrate;
an acoustic resonator portion including a lower electrode, a piezoelectric film, and an upper electrode which are sequentially stacked on the acoustic reflector portion; and
a smoothing layer formed between the acoustic reflector portion and the acoustic resonator portion, wherein:
the acoustic reflector portion includes low acoustic impedance layers and high acoustic impedance layers which are alternately stacked on the substrate;
the high acoustic impedance layers have higher acoustic impedance than the low acoustic impedance layers;
the smoothing layer is an insulating layer, is in contact with the lower electrode and an uppermost part of the acoustic reflector portion, said smoothing layer is formed by spin coating, and has lower acoustic impedance than the low acoustic impedance layers; and
the uppermost part of the acoustic reflector portion is one of the low acoustic impedance layer.

4. A film bulk acoustic resonator comprising:
a substrate;
an acoustic reflector portion formed on the substrate;
an acoustic resonator portion including a lower electrode, a piezoelectric film, and an upper electrode which are sequentially stacked on the acoustic reflector portion; and
a smoothing layer formed between the acoustic reflector portion and the acoustic resonator portion, wherein:
the acoustic reflector portion includes low acoustic impedance layers and high acoustic impedance layers which are alternately stacked on the substrate;
the high acoustic impedance layers have higher acoustic impedance than the low acoustic impedance layers;

the smoothing layer is in contact with the lower electrode and an uppermost part of the acoustic reflector portion, is formed of a spin-on glass material, a fluorine-based resin material, a silicone-based resin material, or an epoxy-based resin material, and has lower acoustic impedance than the low acoustic impedance layers; and the uppermost part of the acoustic reflector portion is one of the low acoustic impedance layers.

5. A film bulk acoustic resonator comprising:

a substrate;

an acoustic reflector portion formed on the substrate;

an acoustic resonator portion including a lower electrode, a piezoelectric film, and an upper electrode which are sequentially stacked on the acoustic reflector portion; and a smoothing layer formed between the acoustic reflector portion and the acoustic resonator portion, wherein:

the acoustic reflector portion includes low acoustic impedance layers and high acoustic impedance layers which are alternately stacked on the substrate;

the high acoustic impedance layers have higher acoustic impedance than the low acoustic impedance layers;

the smoothing layer is an insulating layer, is in contact with the lower electrode and an uppermost part of the acoustic reflector portion, said smoothing layer is formed by spin coating; and an upper surface of the smoothing layer is smoother than the uppermost part of the acoustic reflector portion.

* * * * *